(12) United States Patent
Elia

(10) Patent No.: US 8,611,835 B2
(45) Date of Patent: Dec. 17, 2013

(54) METHOD AND APPARATUS FOR SENSING THE ENVELOPE OF HIGH LEVEL MULTI FREQUENCY BAND RF SIGNALS

(75) Inventor: Avner Elia, Ramat Ishai (IL)

(73) Assignee: QUALCOMM Incorporated, San Diego, CA (US)

( * ) Notice: Subject to any disclaimer, the term of this patent is extended or adjusted under 35 U.S.C. 154(b) by 541 days.

(21) Appl. No.: 11/914,747

(22) PCT Filed: May 21, 2006

(86) PCT No.: PCT/IL2006/000597
§ 371 (c)(1),
(2), (4) Date: Dec. 13, 2007

(87) PCT Pub. No.: WO2006/123349
PCT Pub. Date: Nov. 23, 2006

(65) Prior Publication Data
US 2009/0098846 A1    Apr. 16, 2009

(30) Foreign Application Priority Data

May 21, 2006   (WO) .................. PCT/IL2006/000597

(51) Int. Cl.
*H04B 1/04*   (2006.01)
(52) U.S. Cl.
USPC ............................................ 455/126; 455/91
(58) Field of Classification Search
CPC .................................................. H03G 3/3042
USPC ......... 455/126–127.5, 91–129; 330/295, 297, 330/277, 136, 285, 127, 129, 307
See application file for complete search history.

(56) References Cited

U.S. PATENT DOCUMENTS

| | | | |
|---|---|---|---|
| 5,818,298 A | 10/1998 | Dent et al. | |
| 6,160,449 A * | 12/2000 | Klomsdorf et al. | 330/149 |
| 6,236,274 B1 * | 5/2001 | Liu | 330/302 |

(Continued)

FOREIGN PATENT DOCUMENTS

| | | |
|---|---|---|
| WO | WO 03/103149 A2 | 12/2003 |
| WO | WO 2005/011106 A2 | 2/2005 |

OTHER PUBLICATIONS

International Search Report and Written Opinion—PCT/IL2006/000597—ISA/EPO—Aug. 28, 2006.

*Primary Examiner* — Lana N Le
(74) *Attorney, Agent, or Firm* — Ramin Mobarhan

(57) ABSTRACT

Method and apparatus for sensing the envelope of high level multi frequency band RF signals in power amplifiers. For each frequency band, an RF transistor, such as a FET or a bipolar transistor is operated essentially at a non-linear operating point (e.g., in Class B, AB or C) at the frequency band. The RF transistor is fed by a DC power supply trough an RF filter and terminated by a dummy load that is tuned to the frequency band so as to terminate the RF components in the output signal of the RF transistor. An RF signal of the frequency band is fed into the input of the RF transistors and an output signal representing the envelope is obtained from the fluctuating current drawn from the DC power supply by the RF transistor, during the time period when the RF signal is applied to the input. The output signals obtained from all RF transistors that operate within their corresponding frequency band are combined to a common output, such that the output signal at this common point is essentially equal to the output signal that corresponds to one of the frequency bands.

12 Claims, 5 Drawing Sheets

(56) References Cited

U.S. PATENT DOCUMENTS

| | | | |
|---|---|---|---|
| 6,384,688 B1* | 5/2002 | Fujioka et al. | 330/302 |
| 6,437,641 B1 | 8/2002 | Bar-David | |
| 7,046,090 B2* | 5/2006 | Veinblat | 330/285 |
| 7,058,369 B1* | 6/2006 | Wright et al. | 455/114.2 |
| 7,133,082 B2* | 11/2006 | Limberg | 455/353 |
| 7,373,127 B2* | 5/2008 | Reed | 455/259 |
| 2003/0062950 A1* | 4/2003 | Hamada et al. | 330/127 |
| 2003/0231062 A1* | 12/2003 | Bar-David et al. | 330/297 |
| 2004/0018821 A1* | 1/2004 | Bar-David et al. | 455/149 |
| 2004/0130396 A1* | 7/2004 | Chen | 330/302 |
| 2004/0184554 A1* | 9/2004 | Pauly et al. | 375/295 |
| 2006/0018404 A1* | 1/2006 | Schutz | 375/300 |
| 2006/0291589 A1* | 12/2006 | Eliezer et al. | 375/302 |
| 2008/0007333 A1* | 1/2008 | Lee et al. | 330/136 |
| 2008/0198944 A1* | 8/2008 | Kim et al. | 455/91 |
| 2009/0295475 A1* | 12/2009 | Bar-David et al. | 455/127.1 |

* cited by examiner

METHOD AND APPARATUS FOR SENSING THE ENVELOPE OF HIGH LEVEL MULTI FREQUENCY BAND RF SIGNALS

FIELD OF THE INVENTION

The present invention relates to the field of RF power amplifiers. More particularly, the invention relates to a method and apparatus for sensing the envelope of high level RF signals.

BACKGROUND OF THE INVENTION

Robust implementation of high-level envelope sensing (ES) in a VLSI chip is a major challenge. ES is an essential part of many RF systems. One such application is an implementation of the eXcess eNvelope eNhancement (XNN®) technique for power amplifiers (PA), which is disclosed in U.S. Pat. No. 6,437,641 and proposes a solution for efficient enhancement and power boost of wireless power amplifiers, including WiFi and WiMAX power amplifiers.

A typical implementation of an XNN® PA is illustrated in FIG. 1 (Prior Art). The Envelope Sensor (ES) provides high-level detection of the transmitted signals. A conventional technique for detection of RF signals employs diode-based detector. However, such detector diodes are usually capable of handling low power signals in the order of 1-10 mW. The VEC™ circuit (as described in U.S. Pat. No. 6,831,519) requires input signals of the order of 30-300 mW. Therefore, whenever a diode-based detector is used to detect the envelope of the RF signal, it requires amplification, which results in a substantial delay which is unacceptable for most of the XNN® applications.

An RF transistor, operating essentially at a non-linear operating point at the RF frequency range, such as in class B, class AB or class C, might also be used as a detection element. The RF transistor is terminated by a dummy load, or embedded as part of the feedback mechanism in conjunction with the VEC™. The current drawn by the RF transistor is proportional to its RF signal, while the threshold level depends on the biasing condition of its operation class. A detected signal might be obtained by sampling this current and filtering it from RF frequency components. High detection levels, up to few hundred watts, may be obtained this way (for example in WO 03/103149), as shown in FIG. 2 (prior art).

All the methods described above have not yet provided satisfactory solutions to the problem of efficiently sensing the envelope of high level RF signals.

It is therefore an object of the present invention to provide a method and circuitry for efficiently sensing the envelope of high level RF signals.

Other objects and advantages of the invention will become apparent as the description proceeds.

SUMMARY OF THE INVENTION

The present invention is directed to a method for sensing the envelope of high level multi frequency band RF signals in power amplifiers. For each frequency band, an RF transistor, such as a FET or a bipolar transistor, is operated essentially at a non-linear operating point (e.g., in Class B, AB or C) at the frequency band. The RF transistor is fed by a DC power supply trough an RF filter and terminated by a dummy load that is tuned to the frequency band so as to terminate the RF components in the output signal of the RF transistor. An RF signal of the frequency band is fed into the input of the RF transistors and an output signal representing the envelope is obtained from the fluctuating current drawn from the DC power supply by the RF transistor, during the time period when the RF signal is applied to the input. The output signals obtained from all RF transistors that operate within their corresponding frequency band are combined to a common output, such that the output signal at this common point is essentially equal to the output signal that corresponds to one of the frequency bands.

Each output signal is obtained by filtering out the RF components from the fluctuating current, thereby obtaining the mean detected current, which is monotonically related to the envelope of the RF signal. The input and the output of the amplifier may be matched, for causing the amplifier to be unconditionally stable under any load and/or level of RF signal.

Whenever the RF signals are derived from an up-conversion of corresponding IF signals, each output signal may be obtained by sensing the envelope of the IF signals. Each output signal may also be obtained by sensing the envelope of the baseband signals that are used to modulate the RF signals.

Each output signal is obtained by sensing the envelope of the baseband signals that are used to modulate the RF signals, transforming the sensed baseband signals to a digital format, representing the envelope value by an in-phase (I) and quadrature (Q) components and digitally calculating the absolute value of the envelope from the values of the I and Q components.

The present invention is also directed to an apparatus for sensing the envelope of high level multi frequency band RF signals in power amplifiers, that comprises for each frequency band:

a) an RF transistor having an input into which an RF signal of the frequency band is fed, the RF transistors operating essentially at a non-linear operating point at the frequency band;
b) an RF filter for feeding the RF transistor from a DC power supply;
c) a dummy load that is tuned to the frequency band, for terminating the RF components in the output signal of the RF transistor;
d) circuitry for obtaining an output signal representing the envelope from the fluctuating current drawn by the RF transistor from the DC power supply during the time period when the RF signal is applied to the input; and
e) circuitry having a common output, for combining the output signals obtained from all RF transistors, each operated within its corresponding frequency band, such that the output signal at the common output is essentially equal to the output signal that corresponds to one of the frequency bands.

The apparatus may further comprise a matching circuitry for matching the input and the output of the amplifier, thereby causing the amplifier to be unconditionally stable under any load and/or level of RF signal.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The Envelope Sensor (ES):

The ES block senses the information signal, which is the input signal to the block, and delivers its envelope to the ES output. The ES circuit can be implemented as part of the BB, IF, or RF integrated circuits ("chip"s) or as a stand-alone chip. It may also be implemented as part of a fully integrated solution.

Figure 1:
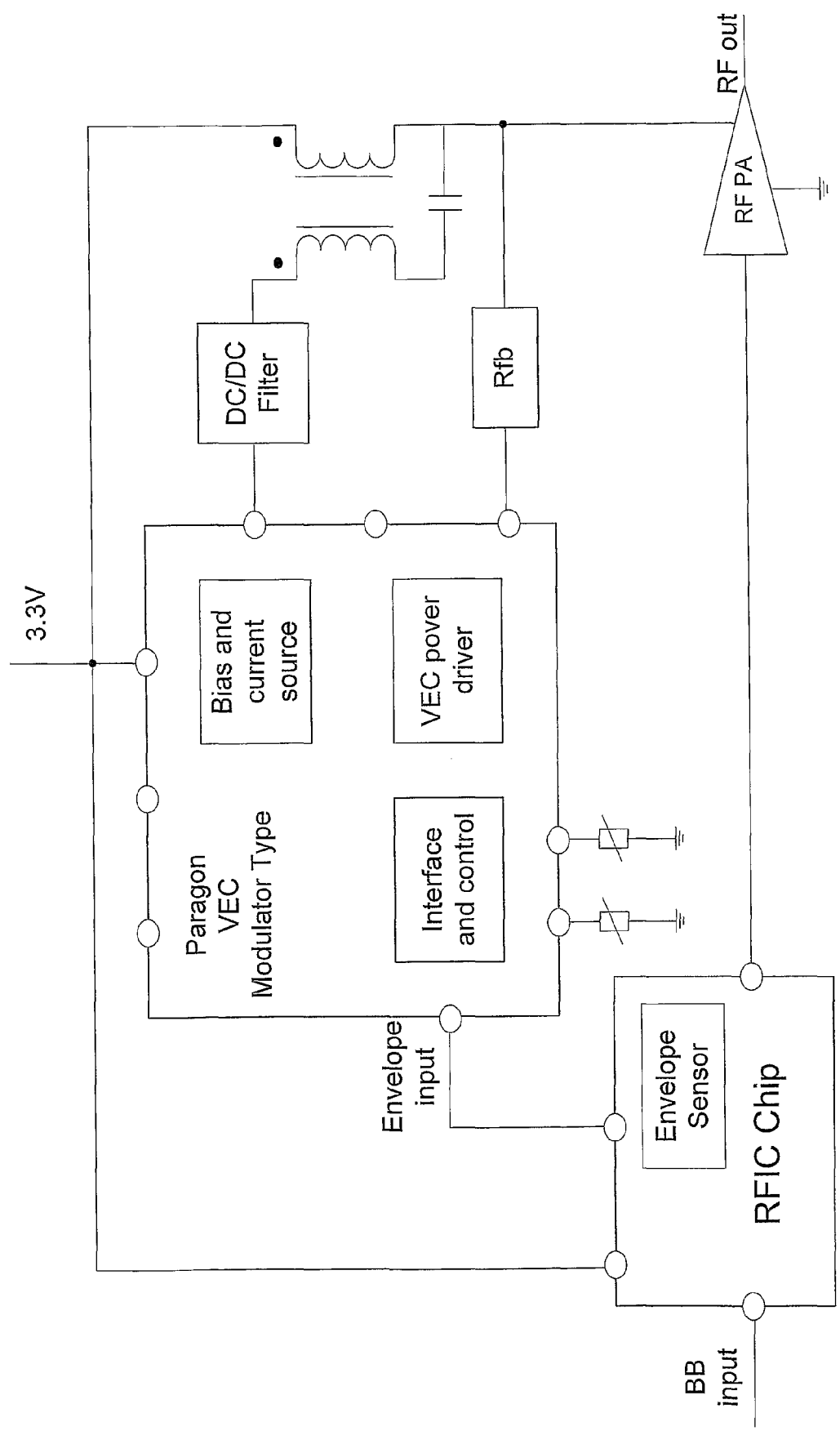
FIG. 1 (Prior Art) illustrates a typical implementation of an XNN® PA.
Figure 2:
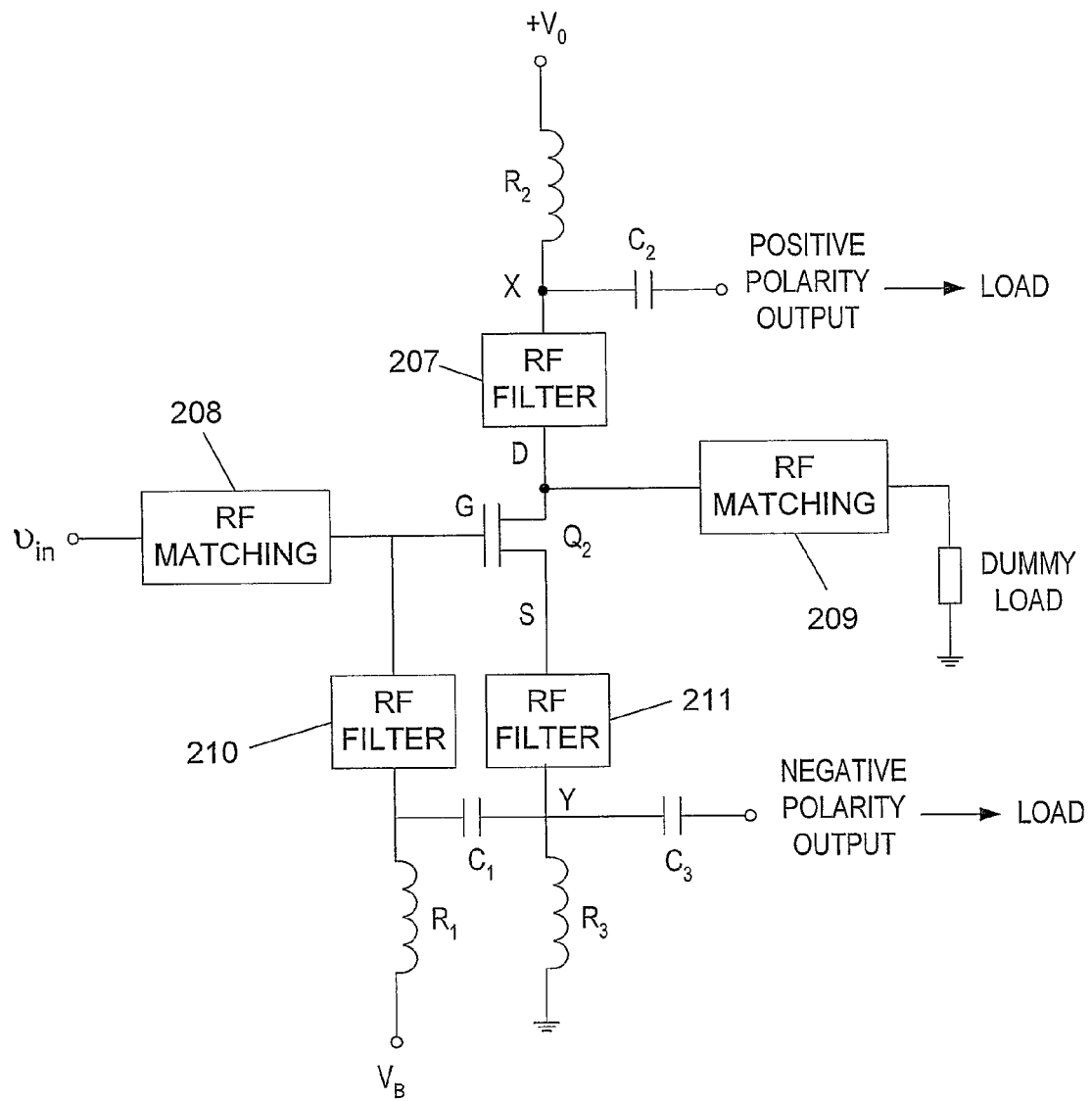
FIG. 2 (prior art) illustrates a conventional High-level envelope sensor.

FIG. 2 (prior art) illustrates a conventional High-level envelope sensor. Two outputs with opposite polarities may be obtained from this sensor. Negative polarity is achieved by sampling the current at the drain (in case a FET transistor is used) or Collector if using BJT transistor. Positive polarity is achieved by sampling the signal at the source or emitter of those transistors.

RF Envelope Sensor

Figure 3:
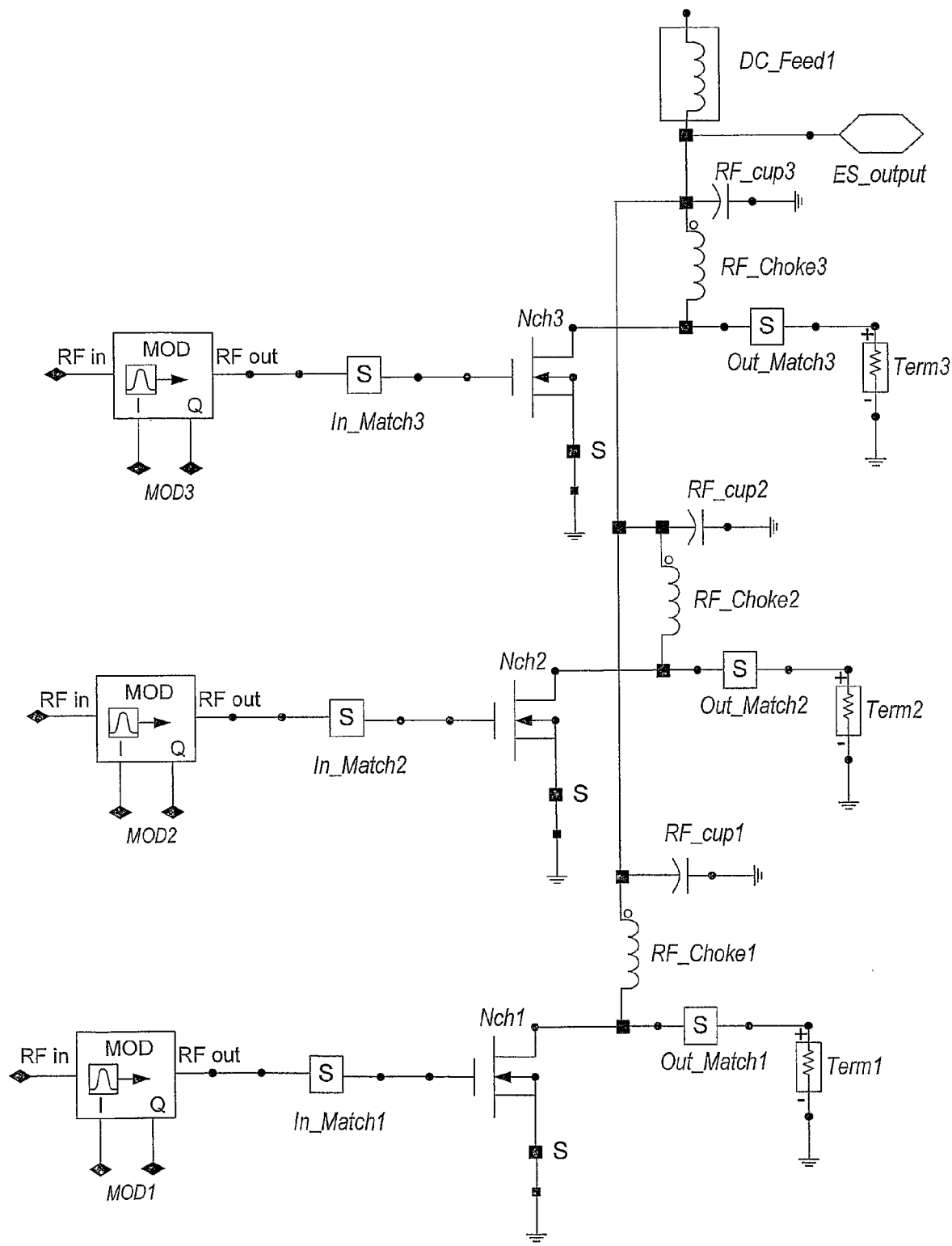
FIG. 3 illustrates an RF Envelope Sensor for detecting the envelope signal is illustrated, according to a preferred embodiment of the invention.

An RF Envelope Sensor for detecting the envelope signal is illustrated, according to a preferred embodiment of the invention, in FIG. 3. This detection method may be applied for detecting video envelope of signals in several frequency bands within a single circuit. This may be done by connecting together video envelope outputs of several RF transistors, each tuned to its corresponding frequency band. For each frequency band, only one of the transistors is operative, while the others stay in an idle mode. This connection, usually termed "open collector" connection, enables using one VEC™ for multi band applications.

IF-ES

Figure 4:
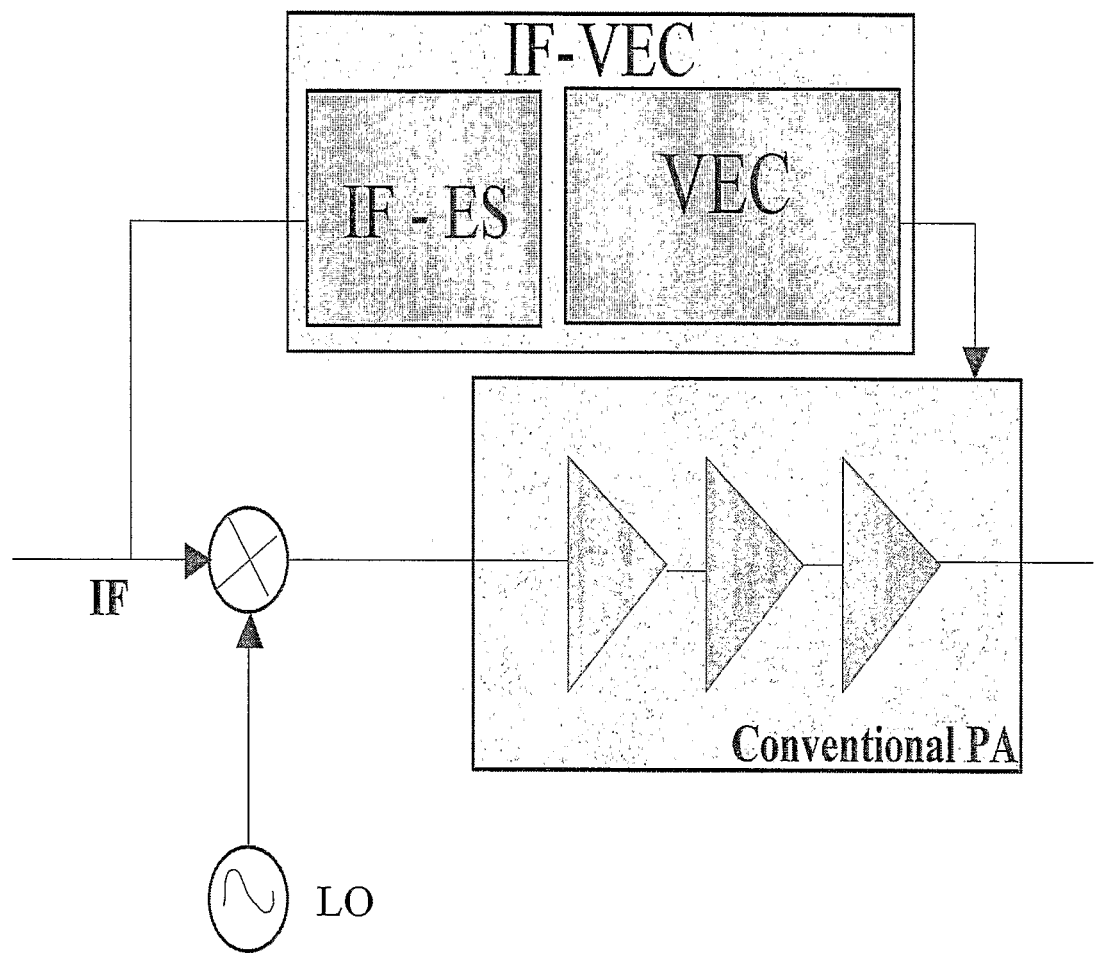
FIG. 4 is a block diagram of an XNN® with IF detection, according to a preferred embodiment of the invention.

FIG. 4 is a block diagram of an XNN® with IF detection, according to a preferred embodiment of the invention. In this implementation, the video envelope is detected from an IF modulated signal. The circuit implementation in this case is very similar to the RF-ES implementation and is applicable to all cases, except for direct up-conversion architectures.

Figure 5:
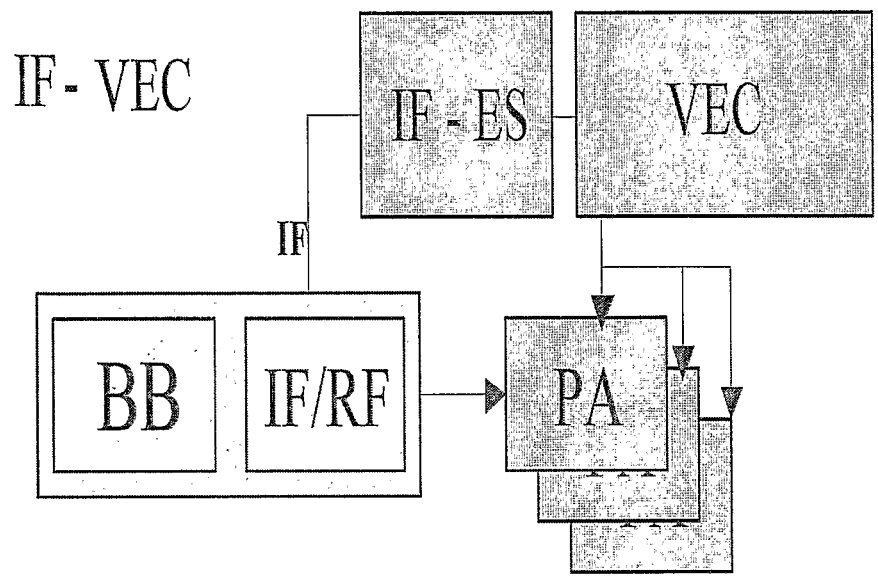
FIG. 5 describes an implementation of multi-XNN® PA system with IF detection, according to a preferred embodiment of the invention.

FIG. 5 describes an implementation of multi-XNN® PA system with IF detection, according to a preferred embodiment of the invention.

BB-ES

Two alternatives for base band signal used for envelope sensing are considered. The preferred embodiment uses the base-band (BB) in-phase and quadrature (I and Q) signal components in their digital format for computing the envelope amplitude in the digital domain (Envelope=$\sqrt{I^2+Q^2}$). The computation can be done in the BB Digital Signal Processor (DSP). The delay between the RF and the VEC™ paths is compensated digitally. The analog video envelope to be provided as the input to the VEC™ may be obtained by applying the digital video envelope to a digital-to-analog converter (DAC).

Figure 6:
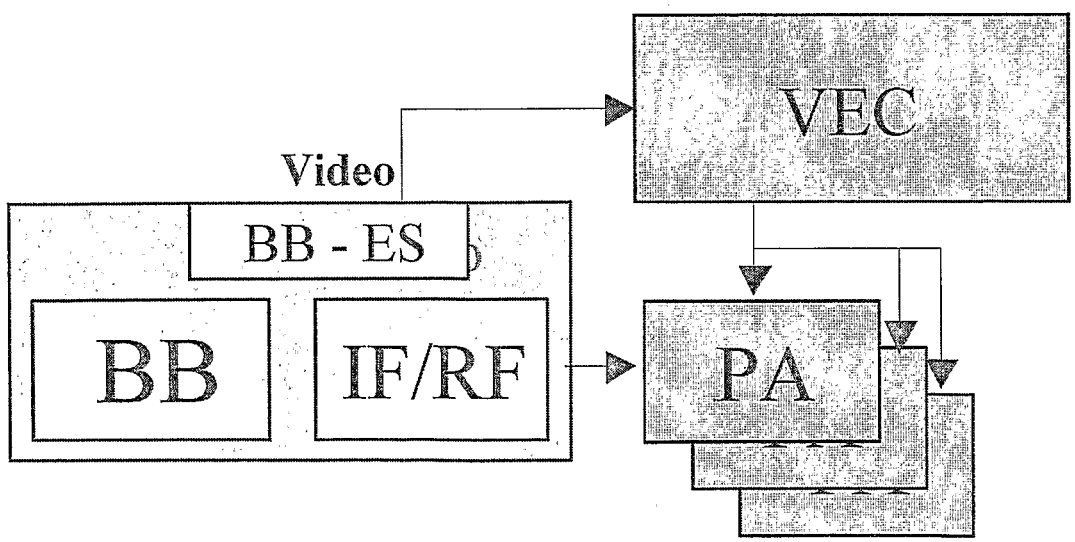
FIG. 6 illustrates an alternative implementation of FIG. 5.

FIG. 6 illustrates an alternative solution according to a preferred embodiment of the invention. An analogue circuit is used to compute the video envelope of the analog domain base-band signal by computing the square root $\sqrt{I^2+Q^2}$ of the sum of the squares of the in-phase and quadrature components, or some reasonable approximation of the envelope using a simplified computation (some of which can be found in the widespread literature).

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method for sensing the envelope of high level multi frequency band RF signals in several power amplifiers connected to a common Voltage Enhancement Circuitry (VEC), comprising:
    a) For each frequency band:
        a.1) providing an RF transistor operating essentially at a non-linear operating point at said frequency band, said RF transistor being fed by a DC power supply trough an RF filter and terminated by a dummy load that is tuned to said frequency band, for terminating the RF components in the output signal of said RF transistor;
        a.2) feeding an RF signal of said frequency band into the input of said RF transistors;
        a.3) obtaining a baseband or IF output signal representing said envelope from the fluctuating current drawn by said RF transistor from said DC power supply during the time period when said RF signal is applied to said input; and
    b) Combining the video envelope output signals obtained from all RF transistors, each of which being tuned to its corresponding frequency band, to a common output by connecting said video envelope output signals together, such that said common output is essentially equal to the output signal that corresponds to one of the frequency bands;
wherein said common output is capable of being used to control the level of enhancement provided by said Voltage Enhancement Circuitry (VEC) to said several power amplifiers.

2. A method according to claim 1, wherein each output signal is obtained by filtering out the RF components from the fluctuating current, thereby obtaining the mean detected current, being monotonically related to the envelope of the RF signal.

3. A method according to claim 2, wherein the RF transistor is a FET or a bipolar transistor.

4. A method according to claim 1, further comprising matching the input and the output of the amplifier, thereby causing said amplifier to be unconditionally stable under any load and/or level of RF signal.

5. A method according to claim 1, wherein the non-linear operating point is selected from the following classes of operation:
    Class B;
    Class AB;
    Class C.

6. A method according to claim 1, wherein the dummy load at the output of each RF transistor is a pure resistance or a pure reactance or any combination thereof.

7. A method according to claim 1, wherein whenever the RF signals are derived from an up-conversion of corresponding IF signals, each output signal obtained by sensing the envelope of said IF signals.

8. A method according to claim 1, wherein each output signal is obtained by sensing the envelope of baseband signals that are used to modulate the RF signals.

9. A method according to claim 8, wherein each output signal is obtained by:
   a) sensing the envelope of the baseband signals that are used to modulate the RF signals;
   b) transforming the sensed baseband signals to a digital format;
   c) representing the envelope value by an in-phase (I) and quadrature (Q) components; and
   d) digitally calculating the absolute value of said envelope from the values of said I and Q components.

10. Apparatus for sensing the envelope of high level multi frequency band RF signals in power amplifiers connected to a common Voltage Enhancement Circuitry (VEC), said apparatus comprises for each frequency band:
   a) an RF transistor having an input into which an RF signal of said frequency band is fed, said RF transistors operating essentially at a non-linear operating point at said frequency band;
   b) an RF filter for feeding said RF transistor from a DC power supply;
   c) a dummy load that is tuned to said frequency band, for terminating the RF components in the output signal of said RF transistor;
   d) circuitry for obtaining a baseband or IF output signal representing said envelope from the fluctuating current drawn by said RF transistor from said DC power supply during the time period when said RF signal is applied to said input; and
   e) circuitry having a common output, for combining the video envelope output signals obtained from all RF transistors, each of which being tuned to its corresponding frequency band by connecting said video envelope output signals together, such that said common output is essentially equal to the output signal that corresponds to one of the frequency bands;

wherein said common output is capable of being used to control the level of enhancement provided by said Voltage Enhancement Circuitry (VEC) to said several power amplifiers.

11. Apparatus according to claim 10, in which the RF transistor is a FET or a bipolar transistor.

12. Apparatus according to claim 10, further comprising a matching circuitry for matching the input and the output of the amplifier, thereby causing said amplifier to be unconditionally stable under any load and/or level of RF signal.

\* \* \* \* \*